(12) United States Patent
Toyserkani et al.

(10) Patent No.: US 10,400,119 B2
(45) Date of Patent: Sep. 3, 2019

(54) METHOD AND APPARATUS FOR AEROSOL-BASED THREE-DIMENSIONAL (3D) PRINTING OF FLEXIBLE GRAPHENE ELECTRONIC DEVICES

(71) Applicants: Ehsan Toyserkani, Waterloo (CA); Elahe Jabari, Waterloo (CA)

(72) Inventors: Ehsan Toyserkani, Waterloo (CA); Elahe Jabari, Waterloo (CA)

( * ) Notice: Subject to any disclaimer, the term of this patent is extended or adjusted under 35 U.S.C. 154(b) by 380 days.

(21) Appl. No.: 15/148,020

(22) Filed: May 6, 2016

(65) Prior Publication Data
US 2016/0326386 A1  Nov. 10, 2016

Related U.S. Application Data

(60) Provisional application No. 62/179,412, filed on May 7, 2015.

(51) Int. Cl.
| | | |
|---|---|---|
| *C09D 11/037* | (2014.01) | |
| *H01L 21/768* | (2006.01) | |
| *H01L 21/288* | (2006.01) | |
| *B33Y 70/00* | (2015.01) | |
| *H01L 23/532* | (2006.01) | |
| *C09D 11/033* | (2014.01) | |
| *B29C 64/112* | (2017.01) | |
| *B33Y 10/00* | (2015.01) | |

(Continued)

(52) U.S. Cl.
CPC .......... *C09D 11/037* (2013.01); *B29C 64/112* (2017.08); *B33Y 70/00* (2014.12); *C09D 11/033* (2013.01); *H01L 21/288* (2013.01); *H01L 23/53276* (2013.01); *B29K 2995/0005* (2013.01); *B33Y 10/00* (2014.12); *B33Y 30/00* (2014.12); *H01L 51/0004* (2013.01)

(58) Field of Classification Search
CPC ... C09D 11/037; C09D 11/033; B29C 64/112; B29C 64/165; H01L 23/53276; H01L 21/288; H01L 51/0004; B33Y 70/00; B33Y 30/00; B33Y 10/00; B29K 2995/0005; B23K 2201/36
See application file for complete search history.

(56) References Cited

U.S. PATENT DOCUMENTS

| | | |
|---|---|---|
| 9,079,764 B1 | 7/2015 | Hersam et al. |
| 9,399,580 B2 * | 7/2016 | Qiu ........................ H01G 11/36 |

(Continued)

OTHER PUBLICATIONS

Jabari et al., "Aerosol-Jet printing of highly flexible and conductive graphene/silver patterns", Materials Letters, vol. 174 (2016), pp. 40-43, Mar. 15, 2016.

(Continued)

*Primary Examiner* — Nahida Sultana
(74) *Attorney, Agent, or Firm* — Gowling WLG (Canada) LLP; Jeffrey W. Wong (57) ABSTRACT

The disclosure is directed at a method and system for three-dimensional (3D) printing of flexible graphene electronic devices and deposition of graphene on non-planar surfaces. By using a printer ink that includes a stabilized graphene powder and a pair of solvents, the printer ink provides for a material that overcomes disadvantages of current systems. In one embodiment, the pair of solvents are cyclohexanone and terpineol. The stabilized graphene powder preferably includes a polymer such as, but not limited to ethyl cellulose.

15 Claims, 12 Drawing Sheets

(51) Int. Cl.
*B33Y 30/00* (2015.01)
*H01L 51/00* (2006.01)

(56) References Cited

U.S. PATENT DOCUMENTS

| | | |
|---|---|---|
| 2010/0176337 A1 | 7/2010 | Zhamu et al. |
| 2013/0037780 A1* | 2/2013 | Kivioja ............... G01L 1/2293 257/26 |
| 2013/0210218 A1 | 8/2013 | Accardi et al. |
| 2013/0217215 A1 | 8/2013 | Ward et al. |
| 2013/0272950 A1* | 10/2013 | Yun ..................... B82Y 30/00 423/447.1 |
| 2014/0177178 A1 | 6/2014 | Crain et al. |
| 2014/0321028 A1 | 10/2014 | Lee et al. |
| 2015/0259212 A1* | 9/2015 | Li ........................ B82Y 40/00 428/221 |
| 2015/0307730 A1* | 10/2015 | Hersam ................ C09D 11/52 430/308 |
| 2017/0081537 A1* | 3/2017 | Hersam .................... B41J 2/01 |
| 2017/0306127 A1* | 10/2017 | Bocchini ................ H01G 11/32 |
| 2018/0010001 A1* | 1/2018 | Hersam .................. B05D 1/02 |

OTHER PUBLICATIONS

Jabari et al., "Laser heat treatment of aerosol-jet additive manufactured graphene patterns", Journal of Physics D: Applied Physics, vol. 48 (2015), Aug. 21, 2015.

Jabari et al., "Micro-scale aerosol-jet printing of graphene interconnects", Carbon, vol. 91 (2015), pp. 321-329, May 9, 2015.

* cited by examiner

| Pattern Number | Atomizer Flow Rate±1 (ccm) | Ultrasonic Atomizer Power (V) | Width of the printed Pattern±1 (μm) |
| --- | --- | --- | --- |
| 1 | 50 | 50 | 90 |
| 2 | 48 | 50 | 65 |
| 3 | 38 | 50 | 52 |
| 4 | 30 | 50 | 32 |
| 5 | 25 | 50 | 13 |
| 6 | 48 | 48 | 45 |
| 7 | 38 | 48 | 36 |
| 8 | 30 | 48 | 20 |
| 9 | 25 | 48 | 10 |

METHOD AND APPARATUS FOR AEROSOL-BASED THREE-DIMENSIONAL (3D) PRINTING OF FLEXIBLE GRAPHENE ELECTRONIC DEVICES

CROSS-REFERENCE TO OTHER APPLICATIONS

This application claims the benefit of U.S. patent application Ser. No. 62/179,412, filed May 7, 2015, the contents of which are incorporated herein by reference.

FIELD OF THE DISCLOSURE

The disclosure is directed generally at three-dimensional (3D) printing and, more specifically, at a method and apparatus for aerosol-based 3D printing of flexible graphene electronic devices.

BACKGROUND OF THE DISCLOSURE

The evolution of printers over the years has led to the development of three-dimensional (3D) printers. 3D printing, or additive manufacturing, relates to the process of creating or synthesizing a 3D object via a 3D printer. The use of 3D printers has led to technology which allows objects of any shape or geometry to be produced from a 3D model. During the printing process, successive layers of material are formed under computer control to form the object.

3D inkjet printing is one of the more favorable fabrication processes for printed electronics, or electronic devices, due to its compatibility with a wide range of low viscous inks, its lower material waste, and its capacity for digital and additive patterning. Over time, many different inks have been used for this process, however, the single large drop deposition and drop randomized direction have hindered the deposition of tracks with width less than 60 micron for these printed electronics.

Therefore, there is provided a novel method and apparatus for aerosol-based 3D printing of flexible graphene electronic devices.

SUMMARY OF THE DISCLOSURE

The disclosure is directed at a method and system for three-dimensional (3D) printing of flexible graphene electronic devices. The method and system may also include the deposition of graphene on non-planar surfaces. By using a printer ink that includes a stabilized graphene powder and a pair of solvents, the printer ink provides for a material that overcomes disadvantages of current systems. In one embodiment, the pair of solvents are cyclohexanone and terpineol. The stabilized graphene powder preferably includes a polymer such as, but not limited to ethyl cellulose.

The printer ink is placed inside an ultrasonic atomizer which creates a mist of atomized droplets from particles on the surface of the printer ink. This mist, or particles, is then delivered to a printer nozzle for use in the printing of the flexible graphene electronic device or devices. In one embodiment, the atomizer and the printing nozzle, or apparatus, are discrete components but may also be included in a single system, such as an aerosol-jet printing apparatus.

In one aspect, there is provided a printer ink for use in aerosol-based three-dimensional (3D) printing of flexible graphene electronic devices comprising a stabilized graphene powder, a first solvent able to dissolve a high concentration of graphene and having a surface tension for use in 3D printing, and a second solvent having a high viscosity, a high boiling point and able to dissolve graphene.

In another aspect, there is provided a printer ink for use in aerosol-based three-dimensional (3D) printing of flexible graphene electronic devices comprising a stabilized graphene powder, a first solvent able to dissolve a high concentration of graphene and having a surface tension for use in 3D printing, and a second solvent having a high viscosity, a high boiling point and able to dissolve graphene wherein the stabilized graphene powder comprises chemically exfoliated graphite and a stabilizing polymer.

In another aspect, there is provided a printer ink for use in aerosol-based three-dimensional (3D) printing of flexible graphene electronic devices comprising a stabilized graphene powder, a first solvent able to dissolve a high concentration of graphene and having a surface tension for use in 3D printing, and a second solvent having a high viscosity, a high boiling point and able to dissolve graphene wherein the first solvent is selected from a group consisting of cyclohexanone, ethanol and water.

In yet another aspect, there is provided a printer ink for use in aerosol-based three-dimensional (3D) printing of flexible graphene electronic devices comprising a stabilized graphene powder, a first solvent able to dissolve a high concentration of graphene and having a surface tension for use in 3D printing, and a second solvent having a high viscosity, a high boiling point and able to dissolve graphene wherein the second solvent is selected from a group consisting of terpineol and N-methylpyrrolidone (NMP).

In another aspect, there is provided an apparatus for printing of flexible graphene electronic devices comprising a printer ink including a stabilized graphene powder, a first solvent able to dissolve a high concentration of graphene and having a surface tension for use in 3D printing and a second solvent having a high viscosity, a high boiling point and able to dissolve graphene, an ultrasonic atomizer housing the printer ink, and a three-dimensional (3D) printing apparatus, wherein the ultrasonic atomizer produces a mist of atomized droplets of the printer ink; and wherein the 3D printing apparatus uses the mist of atomized droplets for printing the flexible graphene electronic devices.

In yet another aspect, there is provided a method of three-dimensional (3D) printing of a flexible graphene electronic device comprising producing a printer ink including a stabilized graphene powder, a first solvent able to dissolve a high concentration of graphene and having a surface tension for use in 3D printing, and a second solvent having a high viscosity, a high boiling point and able to dissolve graphene, generating a mist of atomized particles of the printer ink, and delivering mist of atomized particles of the printer ink to a 3D printing apparatus.

DESCRIPTION OF THE DRAWINGS

The following figures illustrate various aspects and embodiments of the system, method and apparatus disclosed herein.

FIG. 10b is a section analysis along the line 10b-10b of FIG. 10a;

DETAILED DESCRIPTION OF THE DISCLOSURE

The disclosure is directed to a method and apparatus for three-dimensional (3D) printing of a flexible graphene electronic device or devices. Examples of electronic devices include, but are not limited to, interconnects, micro-supercapacitors, thin-film-transistors (TFT), transparent conductor thin films and sensors including strain gauges, creep detectors. As is understood, in order to enable 3D printing, a printer ink is required. The printer ink of the current embodiment includes a graphene powder which is mixed with ethyl cellulose (EC) and then combined with a pair of solvents. In a preferred embodiment, one of the solvents is cyclohexanone while the second solvent is terpineol.

Figure 1:
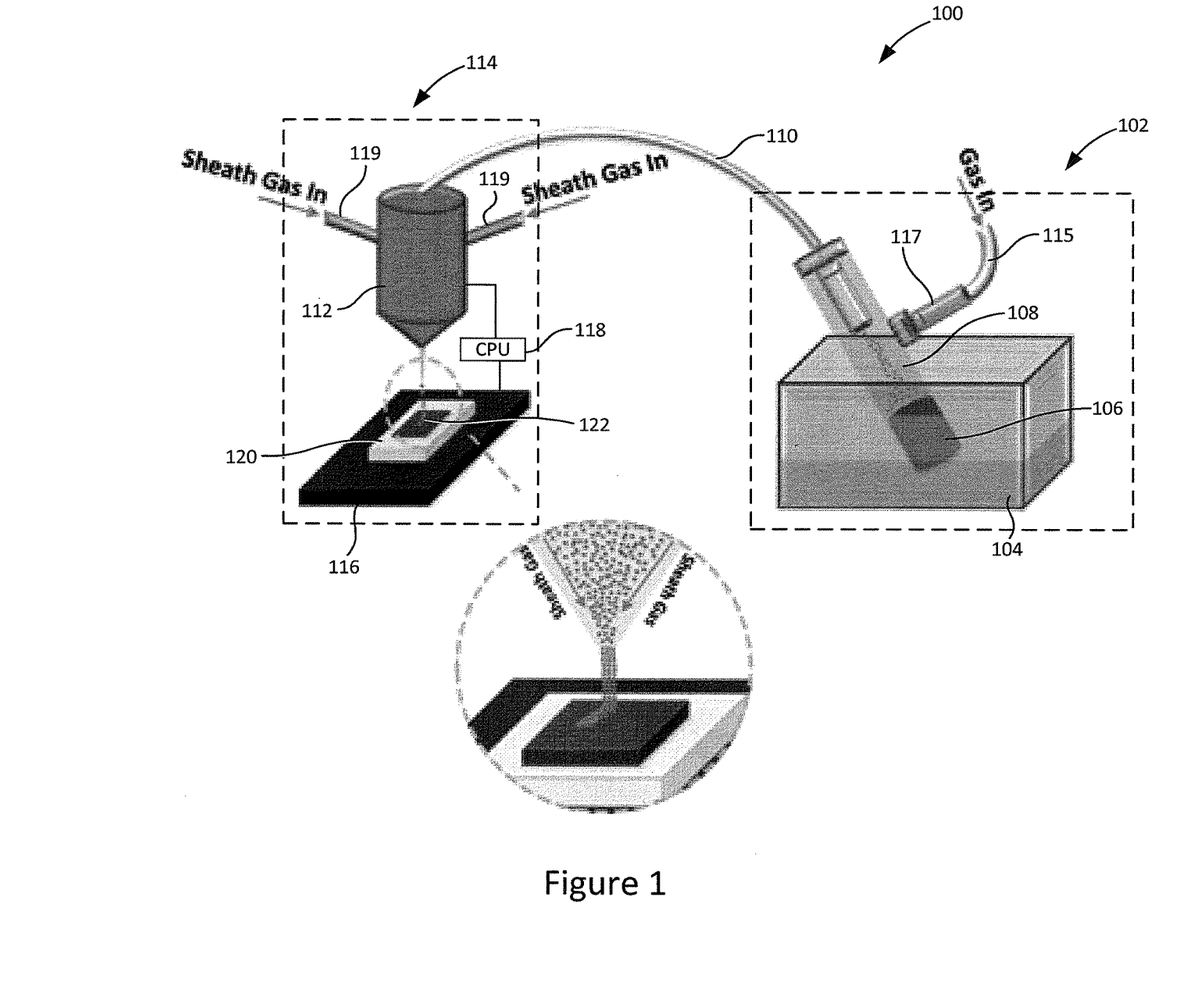
FIG. 1 is a schematic diagram of apparatus for printing a flexible graphene electronic devices.

Turning to FIG. 1, a schematic diagram of a system for aerosol-based, or aerosol-jet based, 3D printing of a flexible graphene electronic device is shown. The system 100 includes an aerosol actuator 102 which includes an agitator 104 and an ultrasonic atomizer 108 for housing a printer ink 106, such as a graphene printer ink. The atomizer 108 may be seen as ink vial. One end of the atomizer 108 is placed within the agitator 104 while the other end of the atomizer 108 is connected via tubing 110 to deliver the printer ink to a printer nozzle 112 within a 3D printer or printing apparatus 114. A gas tube 115 is also connected to a port 117 extending from a body of the atomizer 108 which delivers pressurized gas into the atomizer to assist in transmitting or delivering the graphene printer ink from the actuator 102 to the nozzle 112. In another embodiment, the graphene printer ink may be used in an aerosol-jet printing apparatus which includes the ultrasonic atomizer, the agitator and the 3D printing apparatus.

The 3D printer further includes a movable stage 116 and a central processing unit (CPU) 118 for controlling the nozzle 112 and the movable stage 116. A set of at least one sheath gas tubes 119 is connected to the printer nozzle. Atop the movable stage 116 may be a hot plate 120 and a substrate 122. In the Figure, not all components of the 3D printing apparatus are shown, however, the missing components will be understood by one skilled in the art and that their absence is by design so that there is clarity with respect to the other components of the 3D printing apparatus.

The CPU controls the printing process by determining build trajectories to 3D print flexible graphene electronic devices, as well as by determining process parameters. Operation of the 3D printer to print out a flexible graphene electronic device will be understood by one skilled in the art.

In one embodiment, operation of the actuator is initiated to create a mist of atomized droplets via the atomization of particles in the surface of the graphene printer ink 106. In the preferred embodiment, these particles are then delivered to the 3D printer (through the tubing 110) via a pressurized gas that is pumped into the atomizer via the gas tube 115. The ink particles are then settled within the nozzle 112 of the 3D printing apparatus such that it may be used for printing or depositing once instructed by the CPU. After receiving instructions to print a flexible graphene electronic device, the CPU initiates the pumping of pressurized gas through the sheath gas tubes 119 forcing the ink out of the nozzle onto the substrate. Based on the device being printed, the nozzle directs the ink particles onto the substrate to print a pattern, or layer, on the substrate. This is repeated in a layer-by-layer fashion, as necessary, to complete printing of the electronic device. As the different layers are bring printed, the movable stage 116 moves accordingly to accommodate the printing of the electronic device. A more detailed view of the 3D printing process can be seen in the exploded view of FIG. 1.

Figure 2:
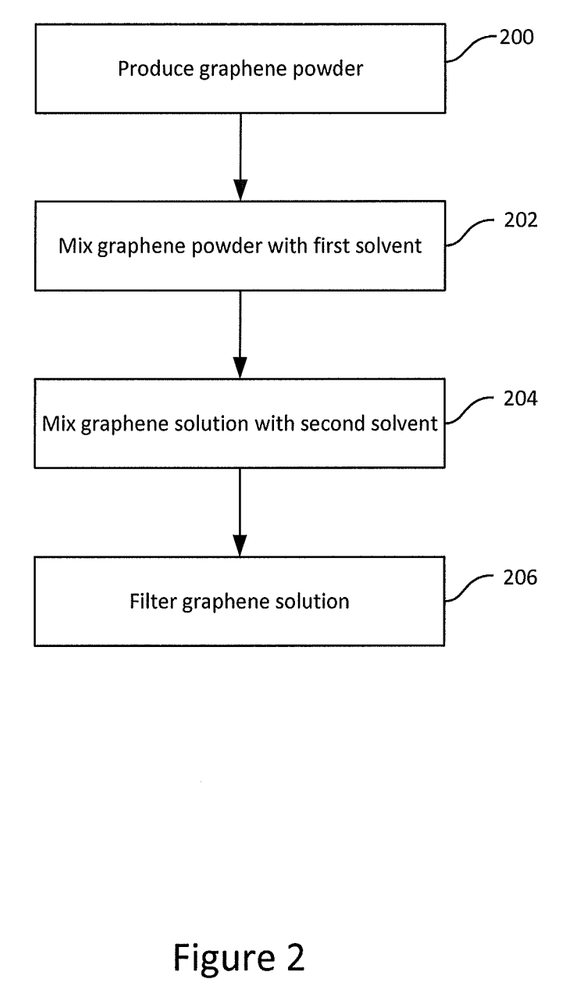
FIG. 2 is a flowchart of a method of producing a graphene printer ink for use in printing a flexible graphene electronic device.

Turning to FIG. 2, a method of producing a graphene printer ink for use in the 3D printing of a flexible graphene electronic device is shown. In a preferred embodiment, the 3D printing process is a micro-scale printing process. The graphene printer ink is preferably manufactured via a graphene powder which is dissolved with selected solvents as will be described below.

Figure 3:
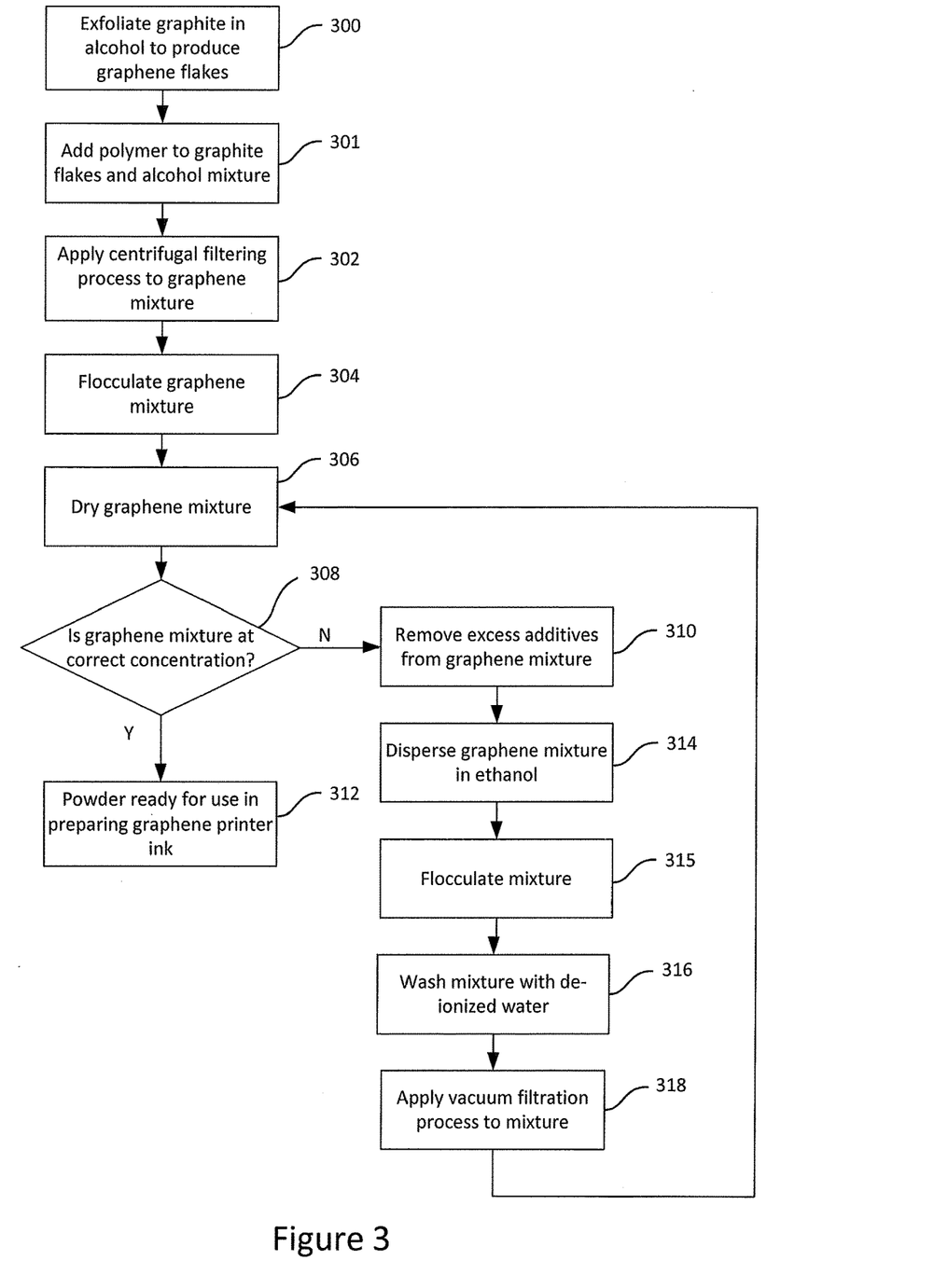
FIG. 3 is a flowchart outlining a method of producing graphene powder for a graphene ink printing ink.

Initially, a graphene powder is produced (200). FIG. 3 provides a flowchart outlining a method of producing the graphene powder which is preferably seen as a stabilized graphene powder.

In preparing the graphene powder, graphite is exfoliated to produce graphene flakes, which can be seen as a graphene mixture (300). In one embodiment, the exfoliation process includes chemically exfoliating graphite in an alcohol, such as ethanol, using sonication power. During this exfoliating process, a polymer, such as ethyl cellulose (EC) or polyvinylpyrrolidone (PVP), is added to the ethanol (301) to increase a yielded amount of graphene flakes in the ethanol.

In a preferred embodiment, EC is used. The EC may also reduce or prevent re-aggregation of the flakes. After the sonication process, larger graphite flakes may be removed such as by applying a centrifugal force filtering process (302). In one embodiment, the solution may be subject to a centrifugal force which causes the graphite flakes to be removed from the graphene mixture.

The stabilized graphene flakes are then flocculated (304) such as by adding a salt solution to the mixture, and then dried (306) into a powder form to produce a stabilized graphene powder. In one embodiment, the salt solution is an aqueous salt solution using sodium chloride (NaCl). In order to produce a graphene powder that is suitable to make a printer ink, a check is performed to determine if the content of graphene within the stabilized graphene powder meets a predetermined level (308). If not, excess additives, such as excess EC, may be removed from the graphene powder (310). This may be achieved by redispersing the graphene powder in ethanol (314) and then flocculating the stabilized graphene flakes in the new powder mixture (315). In one embodiment, this is achieved by adding a salt solution to the new powder mixture. The new powder mixture is then washed with deionized water (316) to remove salt residue and then collected by a vacuum filtration process (318) before being dried (306). Another check to determine the graphene concentration or content level (308) is performed. This may be repeated until the graphene powder meets the pre-determined required characteristics, or concentration level. If the concentration level is sufficient, the powder may then be used to prepare the graphene printer ink.

After the stabilized graphene powder has been produced, the graphene powder is mixed with a first solvent (202) such as, but not limited to cyclohexanone, ethanol or water. This may be seen as a graphene solution. The first solvent preferably can dissolve a high concentration of graphene and has a well-matched surface tension for use with a 3D printing process, such as the preferred aerosol-jet printing process. In a preferred embodiment, cyclohexanone is chosen. In one experimental embodiment, 60 mg/mL of the graphene powder is dispersed in the cyclohexanone to produce a viscosity around 9cP or centipoise.

The graphene and cyclohexanone mixture is then mixed with a second solvent (204) such as, but not limited to, terpineol or N-methylpyrrolidone (NMP). The second solvent preferably has a high viscosity, a high boiling point and is and is capable of dissolving graphene. The presence of the second solvent is used to remove coffee-ring effects on the finished flexible graphene electronic device. Terpineol is preferred due to its viscosity (~67 cP at 20° C.) and boiling temperature. In experiments, it has been demonstrated that terpineol is also capable of dispersing a high concentration of graphene. In one preferred embodiment, the graphene ink is produced with a ratio of 5% to 15% of terpineol by volume with the remainder of the solution being cyclohexanone (along with the stabilized graphene powder. In the most preferred embodiment, the ratio of the solvents is 92.5:7.5 cyclohexanone/terpineol.

After the terpineol has been mixed in, the resultant dispersion or solution may be passed through a filter (206) to limit the flake size of the graphene flakes in the graphene printer ink. In a preferred embodiment, the filter is a 0.2 μm filter to limit the graphene flakes to a size smaller than 200 nm as graphene flakes having this approximate size are atomizeable. In experiments, the resulting graphene printer ink prepared had a concentration around 3.1 mg/ml and viscosity of 21 cP which is compatible with other inks for use with an aerosol-jet printing system and brought about printing patterns with no coffee-ring and defined edges.

Figure 5:
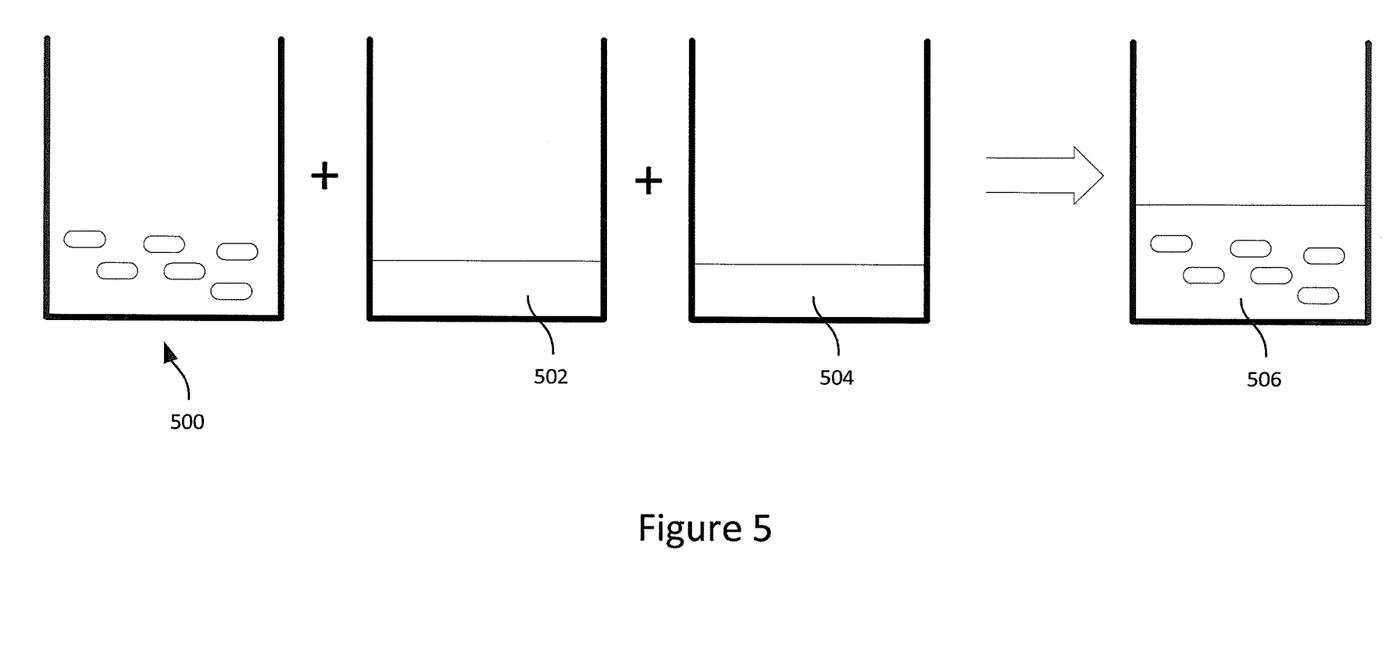
FIG. 5 is a schematic diagram of the graphene printer ink of FIG. 2.

FIG. 5 provides a schematic diagram of the graphene printed ink. The combination of a graphene powder with EC 500 is combined with a first solvent 502, such as cyclohexanone and a second solve 504, such as terpineol to produce a graphene printer ink 506 for use in the system and method of the disclosure.

Figure 4:
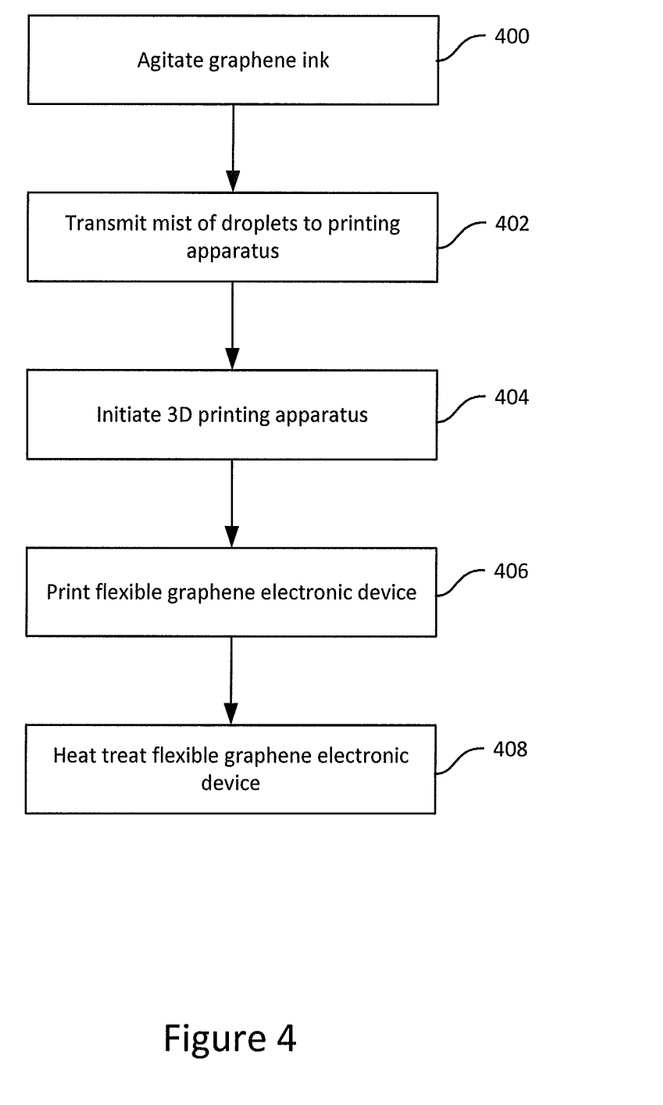
FIG. 4 is a flowchart outlining a method of printing a flexible graphene electronic device.

Turning to FIG. 4, a flowchart outlining a method of printing a flexible graphene electronic device is shown. Initially, the graphene printer ink, such as produced by the method of FIG. 2, and located within an ultrasonic atomizer, is agitated by the agitator (400). The agitation may be initiated by activating operation of the agitator, such as by turning the agitator on. Agitation of the graphene printer ink within the atomizer produces a mist of atomized droplets via the atomization of particles in the surface of the graphene ink. The mist of droplets is then transmitted or delivered to a 3D printing apparatus (402). In one embodiment, a pressurized gas is introduced to the ultrasonic atomizer which pushes the mist through tubing 110 from the atomizer to the printer nozzle of the printing apparatus. The mist, or printer ink, is then stored in the printer nozzle for use in the printing process.

The 3D printing apparatus is then initiated (404) to print the flexible graphene electronic device. In operation, as would be understood, the 3D printing apparatus transmits instructions to the printer nozzle and the movable stage to print out (406) the flexible graphene electronic device based on a pattern or a 3D model of the desired graphene electronic device. The printing process includes the delivery or deposition of the graphene printer ink on to a hot plate atop the movable stage in response to the instructions. In one embodiment, the graphene printer ink is delivered to the hot plate via a pressurized gas which is delivered via the set of sheath gas tubes which pushes the graphene printer ink, preferably in a downward direction, onto the hot plate.

After the electronic device is printed, or deposited by the printing process, the flexible graphene electronic device is heat treated (408) in order to remove the solvents and the EC from the finished flexible graphene electronic device to improve electrical properties of the finished flexible graphene electronic device. In one embodiment, the entire electronic device may be placed in a furnace, or oven. In another embodiment, lasers may be used to directly provide a localized moving heat source to remove the solvents and EC. This is beneficial for flexible graphene electronic devices that have low working temperature substrates.

In experiments, testing of the graphene printer ink for its suitability in use for 3D printing was also performed. The results from the experiments are outlined below. For easier observation and more precise characterization of the printed patterns deposited by the printer nozzle, $Si/SiO_2$ wafers with 300 nm silicon dioxide were chosen as the substrates. Due to intrinsic doping level of graphene and hysteretic behavior of graphene on $Si/SiO_2$ substrate with a hydrophilic surface further treatment of the substrate was performed. For this, surface modification of $Si/SiO_2$ wafers was performed using hexamethyldisilazane (HMDS). After cleaning the $Si/SiO_2$ wafers with 300 nm silicon dioxide and removing all the organic residues using an $O_2$ plasma treatment, the wafers were left in 1:1 HMDS/acetone mixture for 20 hours to form a HMDS film on the surface of silicon wafers to make the surface hydrophobe.

Experimental Data

For experimental purposes, the graphene printer ink was placed in the ultrasonic actuator of the aerosol-jet printer to print interconnects. The printed patterns were annealed on a hot plate at different temperatures to remove solvents and the stabilizer polymer. To view the properties of deposited graphene patterns such as, but not limited to, graphene structure, the number of layers, and the amount of lattice defects, Raman spectroscopy was used. To observe quality and microstructure of the patterns scanning electron microscopy and atomic force microscopy were employed. Sheet resistance of the printed graphene sheet was measured using a 4-probe system along the resistivity of the printed graphene was also calculated.

Figure 6A:
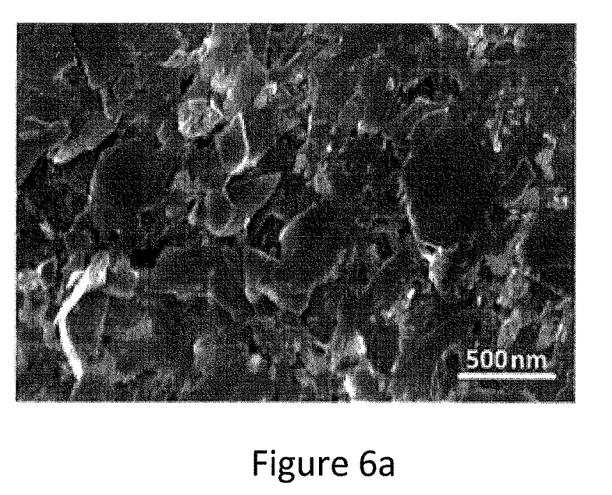
FIG. 6a is a scanning electron microscope image (SEM) of graphene powder.
Figure 6B:
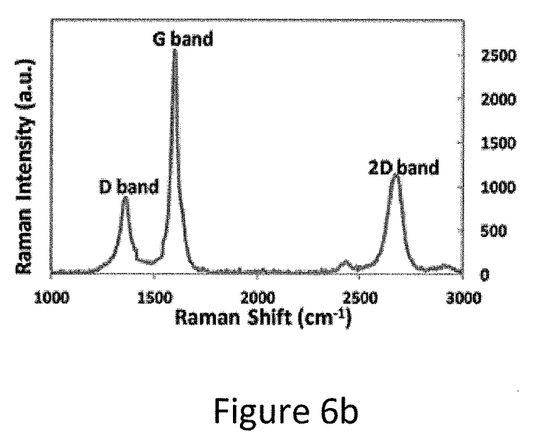
FIG. 6b is a Raman graph of graphene flakes in a highly concentrated dispersion of the stabilized graphene powder on $Si/SiO_2$ wafers.
Figure 6C:
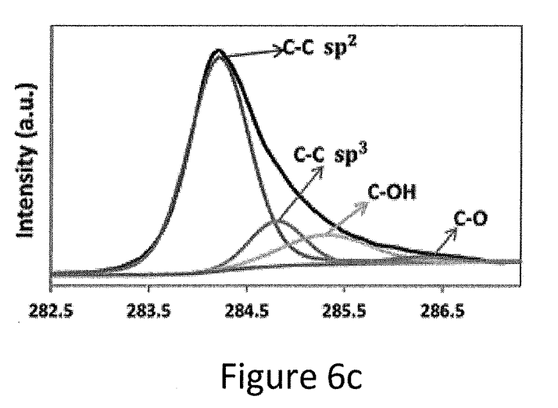
FIG. 6c is an X-ray photoelectron spectroscopy (XPS) spectra of graphene flakes in a highly concentrated dispersion of the stabilized graphene powder on $Si/SiO_2$ wafers.

In experimentation, a scanning electron microscope (SEM) image of the graphene flakes in the prepared powder was taken to observe graphene flake characteristics. This image is shown in FIG. 6a which provides an image of a high density of graphene flakes with nano lateral size. The nano lateral size provides a benefit to the printing process as the graphene printer ink product can be effectively atomized via the ultrasonic atomizer and then delivered by gas flow to the 3D printing apparatus. A Raman measurement of a drop-casted sample of the graphene printer ink on Si/SiO2 wafers was performed at room temperature using a green laser beam (532 nm) at an excitation rate with 20 mW incident power (FIG. 6b). The G band at around 1580 cm$^{-1}$ and 2D band at around 2700 cm$^{-1}$, which are the two most distinct bands for all the graphite and graphene samples, are observed in the Raman graph. The D band is also observed around 1350 cm$^{-1}$ where intensity is related to the number of lattice defects. In experimentation, the ratio of D band intensity to G band, which is considered as estimation for number of the defects, is around 31%. This value was determined to be in a lower range with respect to other reported surfactant exfoliated graphene solutions and reduced graphene oxide. The bonding structure was also investigated using X-ray photoelectron spectroscopy (XPS) with an Al Kα X-ray (1486.7 eV) source (FIG. 6c). As shown in FIG. 6c, peaks at 284.3, 284.8, 285.3, and 286.3 eV are fitted with a sp2 carbon bond, a sp3 carbon bond, C—OH, and C—O, respectively. The total amount of sp2, sp3, C—OH, and C—O bonds, determined by an area ratio method, was around 73%, 12.5%, 13%, and 2%, respectively. The results revealed that only a few percent of carbon is oxygenated. The ratio of sp3/sp2 was calculated at 0.17 which is in agreement with the ratio of ID/IG obtained from the Raman spectrum. The C/O ratio, determined by atomic composition of the sample, was around 6. This amount of oxygen can be due to the adsorption of oxygen, either from the immediate, or ambient, environment or from decomposition of EC on the surface of the graphene. From experimentation, it was concluded that exfoliation, flocculation and drying processes resulted a graphene structure with a low amount, or number, of defects and oxidization.

Figure 7A:
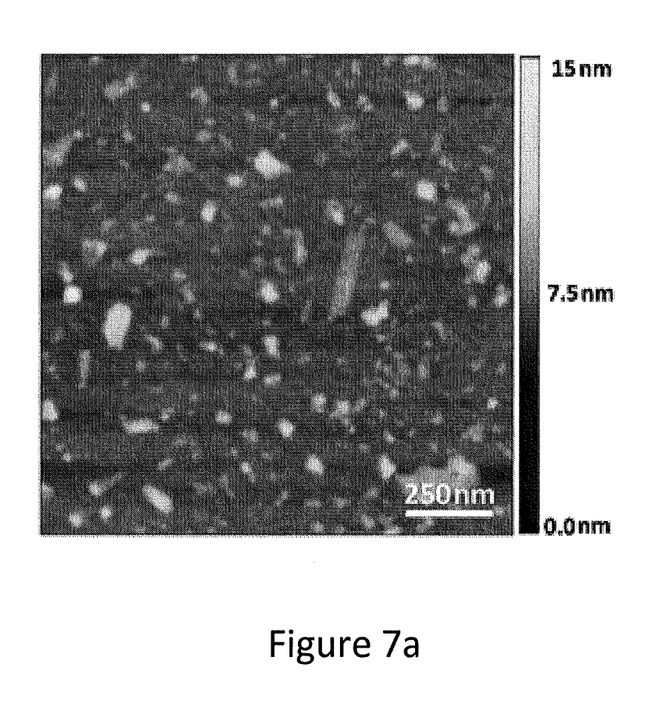
FIG. 7a is an atomic force microscope (AFM) image.
Figure 7B:
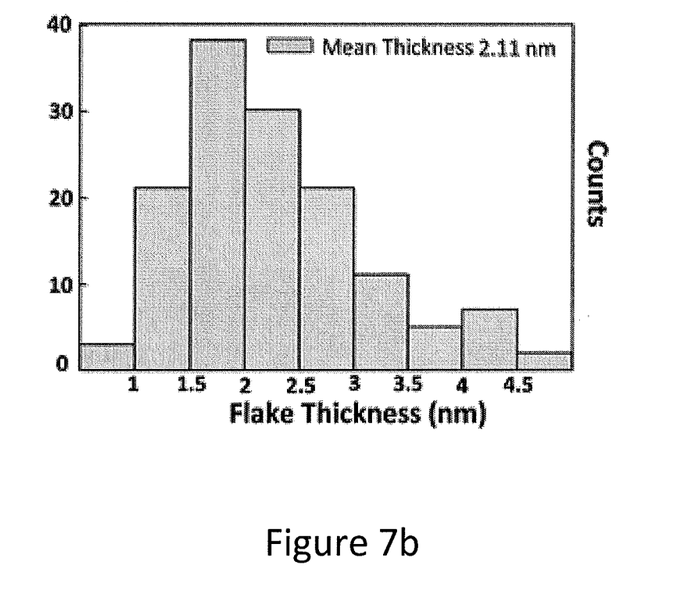
FIG. 7b is an AFM height histogram for a set of graphene flakes from a diluted dispersion of the stabilized graphene powder on $Si/SiO_2$ wafers.

FIG. 7a is an atomic force microscope (AFM) image of graphene flakes on a Si/SiO$_2$ test wafer. The image was obtained with a 0.5 Hz scan rate from a 1.4 μm×1.4 μm scan area of graphene flakes in a highly diluted dispersion of the stabilized graphene powder on Si/SiO$_2$ wafers. Flake thickness was measured for 140 flakes (not severely reaggregated ones) and the results are shown in the flake histogram of FIG. 7b. The mean flake thickness of 2.11 nm states that the graphene powder includes many multi-layer graphene flakes. Considering an effective thickness of 0.34 nm for a single layer graphene and a mean thickness of 2.11 nm for the exfoliated graphene flakes, it was be concluded that each exfoliated graphene flake had approximately six (6) layers.

In testing the microdeposition (or in other words, the interconnect pattern deposited on the substrate), process parameters were set to improve the likelihood of printing high quality patterns/interconnects. The values of the main parameters being controlled included, but were not limited to, atomizer power, sheath gas and atomizer flow rate, deposition velocity, and temperature of the substrate. However, these parameters strongly depend on the properties of the graphene printer ink, surface quality of the substrate, and desired pattern size. Therefore, based on the Si/SiO$_2$ substrate and a desired pattern size, different parameters for the printing process were chosen (such as disclosed in FIG. 8).

Figure 8:
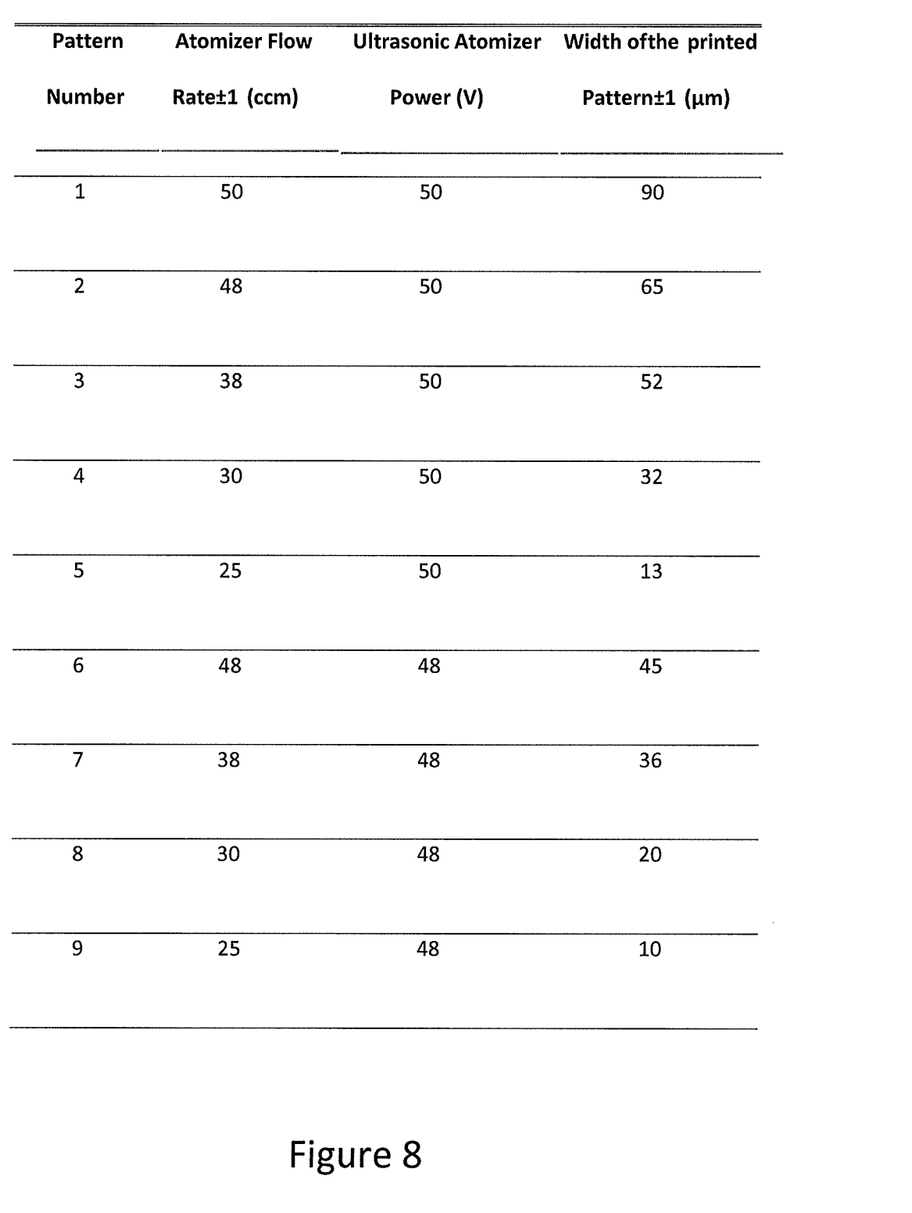
FIG. 8 is a table outlining printing parameters used in obtaining experimental data from printed flexible graphene interconnects.
Figure 9A:
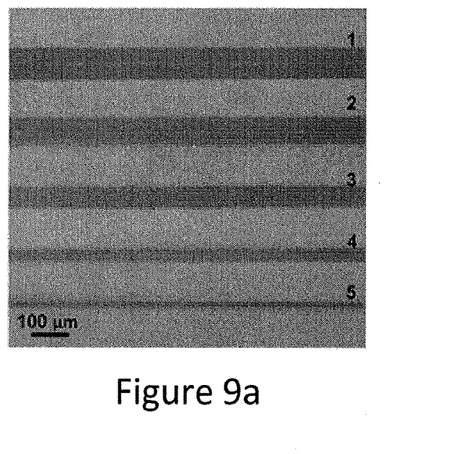
FIG. 9a is an image of 6-layer graphene patterns on treated $Si/SiO_2$ wafers printed based on the parameters listed for patterns 1 to 5 of FIG. 8.
Figure 9B:
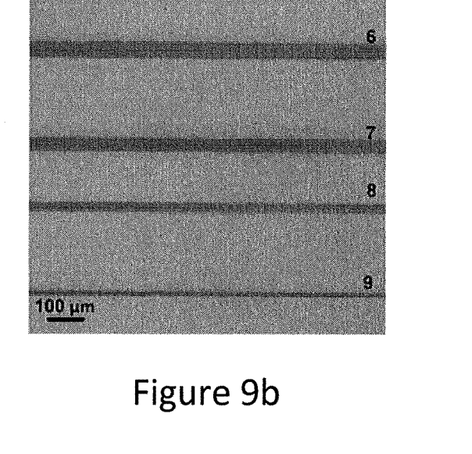
FIG. 9b is an image of 6-layer graphene patterns on treated $Si/SiO_2$ wafers printed based on the parameters listed for patterns 6 to 9 of FIG. 8.
Figure 9C:
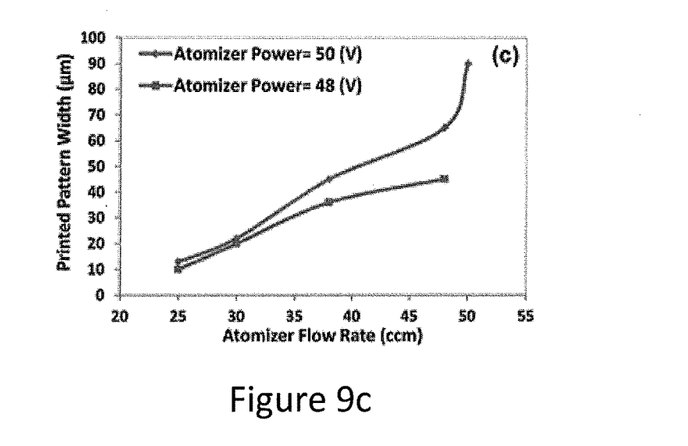
FIG. 9c is a graph reflecting width of the graphene patterns versus atomizer flow rate.

After the printing, or deposition, process, the printed patterns included all the components of the graphene printer ink including graphene, EC, cyclohexanone, and terpineol. To obtain pure graphene patterns or interconnects, the solvents and EC are preferably burned off during post heat treatment. At a temperature above 220° C. (higher than boiling temperature of both solvents), both solvents evaporated. Based on Thermogravimetric analysis (TGA) results, EC decomposed in various steps at different temperatures. In the current experiments, the samples were annealed, using a hot plate, at 250° C. and 400° C. to compare the properties of graphene/EC and pure graphene patterns, respectively. It was noted that the temperature of the substrate during the deposition process was kept at 100° C. which resulted in improved uniform patterns due to improving surface energy and promoting adhesion. As discussed above, as the substrates being used were Si/SiO$_2$ wafers with 300 nm silicon dioxide with a treated surface, it was concluded that the printing apparatus set-up was capable of printing patterns with defined edges and controllable width ranging from 10 to 90 μm. The table of FIG. 8 depicts some of the printing process parameters during the deposition on the wafers and width of the patterns after annealing at 400° C. The width of the as-printed patterns is almost the same as annealed patterns and is also independent of annealing temperature. This is due to surface energy of the heated and treated Si/SiO$_2$ wafers. The pattern with six printed layers and annealed at 400° C. (based on the printing parameters in FIG. 8) were captured using SEM and are shown in FIGS. 9a and 9b. The application of the sheath gas of the printing system mostly affected the quality of the patterns rather than the width of the patterns. Hence in all the mentioned conditions in the table of FIG. 8, sheath gas flow rate was kept constant (around 50 ccm) to print patterns with different widths to present and determine the capability of the system. It was determined that increasing either the atomizer flow rate or the atomizer power would result in wider printed patterns. FIG. 9c illustrates the trend of changes in the size by increasing the atomizer flow rate and the atomizer power. In one embodiment, the sheath gas flow rate is around 45-65 ccm, the atomizer flow rate is around 25-50 ccm and the atomizer power is around 40-50 V.

Figure 10A:
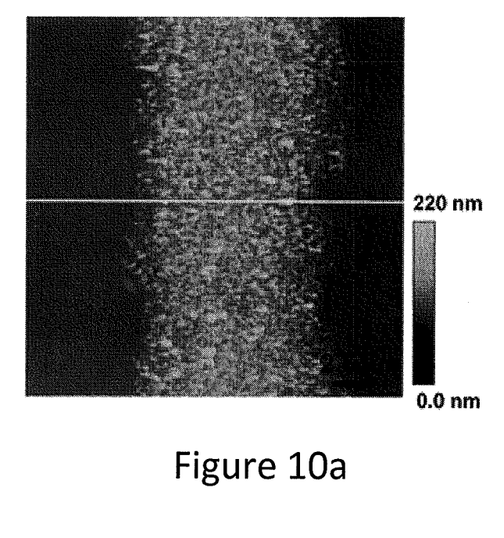
FIG. 10a is an AFM image of a printed pattern.
Figure 10B:
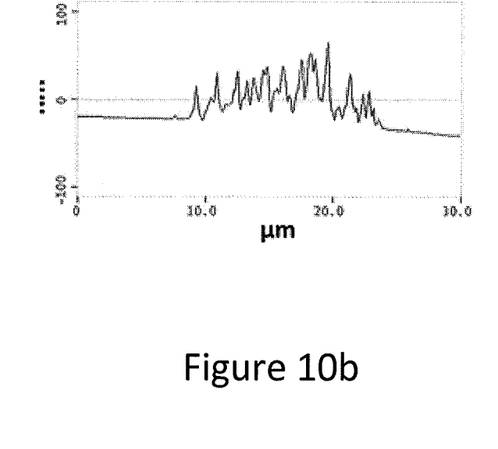

Turning to FIG. 10a, an AFM image of the printed pattern based on the parameters of pattern nine of the table in FIG. 8 is shown with FIG. 10b showing its section analysis along the line 10b-10b of FIG. 10a. As can be seen in FIG. 10a, defined edges which were free of the coffee-ring effect were obtained. Similar results were realized with the other printing patterns.

Turning to FIGS. 11a to 11f, SEM images of microstructure and a Raman spectra for the as-printed patterns and patterns annealed at two different temperatures (as discussed above) are shown. The SEM images show a high density of connected graphene flakes even after annealing at 400° C. The SEM images also show that the edges of the flakes are more creased compared to the flakes of the ink before printing as outlined above with respect to FIG. 6a. It can be an indication of some degree of wrinkling in the graphene flakes in the printed graphene features. Since crumpling of the graphene sheets leads to improve performance of graphene-based devices, due to high resistivity of wrinkled graphene sheet to re-aggregation, these printed patterns seems to be desirable in electronic and energy-storage devices.

Figure 11A:
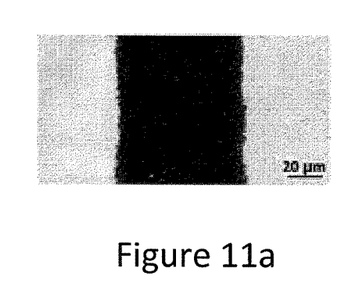
FIG. 11a is a SEM image of a 6-layer as-printed graphene/EC pattern.
Figures 11B, 11C:
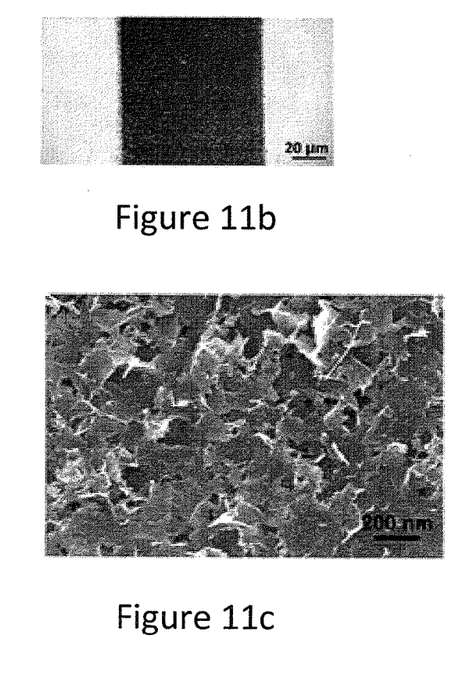
FIGS. 11b and 11c are SEM images of a 6-layer graphene/EC pattern annealed at 250° C.
Figure 11D:
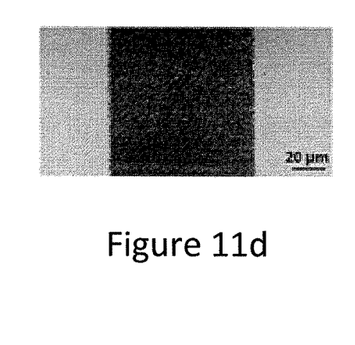
FIGS. 11d and 11e are SEM images of a 6-layer graphene pattern annealed at 400° C.
Figure 11E:
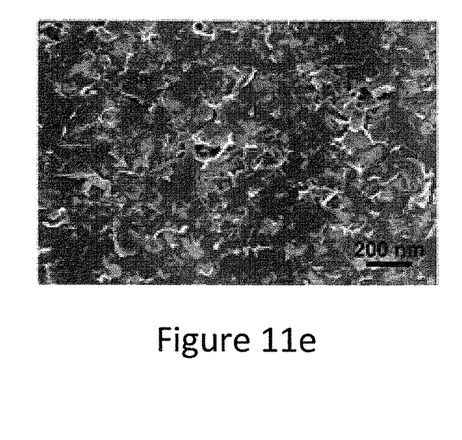
Figure 11F:
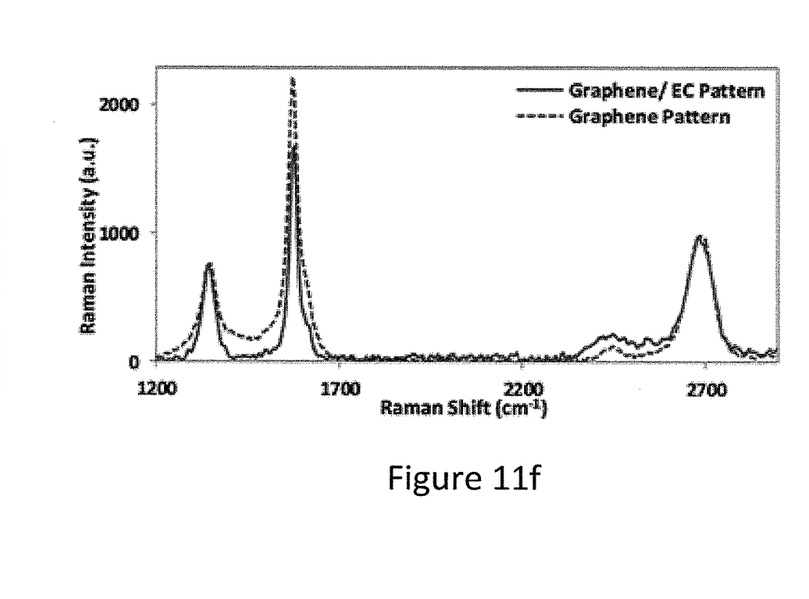
FIG. 11f is a Raman spectra of the printed patterns annealed at 250° C. (graphene/EC pattern) and 400° C. (graphene pattern)

The ratio of D band to G band in Raman spectra of the samples annealed at 250° C. and 400° C. are 41% and 33%, respectively. It is concluded that printing and annealing processes do not significantly change the level of the defects in graphene and graphene-based patterns. Decreasing the ratio of D band to G band by increasing the annealing temperature to 400° C. can be related to totally removing EC and consequently decreasing the number of the edges which easily affect this ratio as an active defect.

Figure 12A:
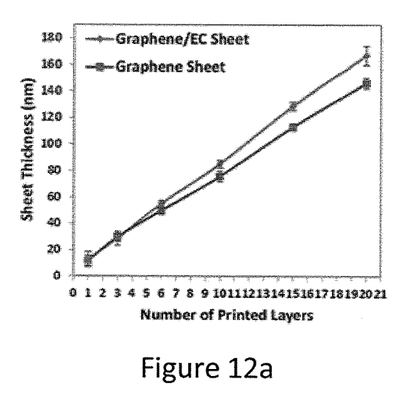
FIG. 12a is a graph reflecting sheet thickness versus number of the printed layers of graphene and graphene/EC printed interconnects.
Figure 12B:
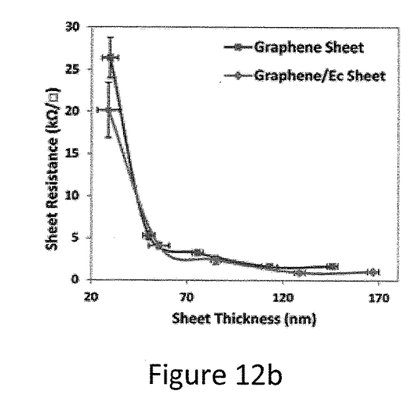
FIG. 12b is a graph reflecting sheet resistance versus sheet thickness of graphene and graphene/EC printed interconnects.
Figure 12C:
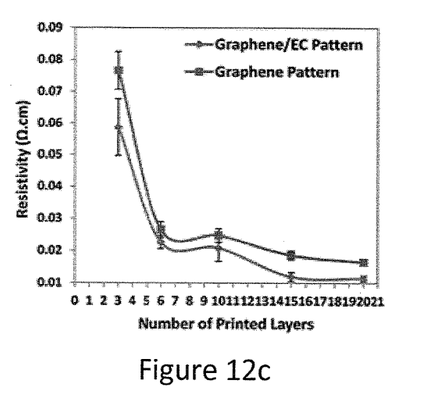
FIG. 12c is a graph reflecting resistivity of the printed sheets versus number of printed layers of graphene and graphene/EC printed interconnects.

In order to measure electrical properties of the printed patterns to define their capability as interconnects, a four (4) points probe technique was used. Some sheets of graphene/EC with different number of the layers were printed on treated Si/SiO$_2$ wafers with a velocity of 0.2 mm/s, 50 ccm sheath gas flow, 48 ccm atomizer flow, and 50 V atomizer power. The deposition process was followed by an annealing process on the hot plate with temperatures of 250° C. and 400° C. to obtain graphene/EC sheets and graphene sheets respectively. Afterward, a thickness and resistance of the sheets were measured in different parts of the sheets using AFM and 4 points probe techniques. The results are shown in FIGS. 12a and 12b, respectively. The resistivity of the printed patterns was also calculated using the Van der Pauw method and the results shown in FIG. 12c. As seen in these figures, by increasing the number of printed layers up to 15 layers, sheet resistance and resistivity of the printed structure decreased due to the higher density of connected flakes. After 15 layers of printing, it was determined that increasing the number of the layers may not significantly affect electrical properties of the printed interconnect. This indicates that saturation of the connected flakes occurs when 15 layers are printed using the graphene printer ink being tested which resulted in a minimum sheet resistance (0.93 kΩ/□ for graphene/EC and 1.64 kΩ/□ for pure graphene) and resistivity (0.012 Ω.cm for graphene/EC and 0.018 Ω.cm for pure graphene) after annealing (at 250° C. and 400° C., respectively). It seems that the existence of decomposed EC in the graphene/EC printed patterns, which are annealed at 250° C., increased connection between graphene flakes and consequently decreased resistivity of the patterns compared to pure graphene patterns which were annealed at 400° C. Improvement in resistivity and sheet resistance was experienced. Obtained sheet resistance and resistivity shows a benefit of using the graphene printer ink in an aerosol-jet printing process to create graphene interconnects or sheets.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein are implemented as a software routine, hardware circuit, firmware, or a combination thereof.

Embodiments of the disclosure or components thereof can be provided as or represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor or controller to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor, controller or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of three-dimensional (3D) printing of a flexible graphene electronic device comprising:
producing a printer ink solution, for use in aerosol-based printing, the printer ink solution including a stabilized graphene powder, a first solvent able to dissolve a high concentration of graphene within the stabilized graphene powder and having a surface tension for use in 3D printing; and a second solvent having a high viscosity, a high boiling point and able to dissolve the graphene within the stabilized graphene powder wherein a size of graphene flakes within the stabilized graphene powder is less than about 200 nm;
generating a mist of atomized particles of the aerosol-based printer ink solution; and
delivering mist of atomized particles of the aerosol-based printer ink solution to a 3D printing apparatus.

2. The method of claim 1 further comprising:
3D printing the flexible graphene electronic device with the mist of atomized particles of the printer ink solution.

3. The method of claim 1 wherein producing the printer ink solution comprises:

exfoliating graphite in an alcohol to produce the graphite flakes in the alcohol;

adding stabilizing polymer to the graphite flakes in the alcohol;

drying the graphite flakes in the alcohol to produce the stabilized graphene powder;

mixing in the first solvent with the stabilized graphene powder; and mixing in the second solvent to produce the printer ink solution.

4. The method of claim 3 wherein the first solvent is selected from a group consisting of cyclohexanone, ethanol and water.

5. The method of claim 3 wherein the second solvent is selected from a group consisting of terpineol and N-methylpyrrolidone (NMP).

6. The method of claim 3 further comprising, before drying the printer ink solution:

flocculating the graphite flakes in the alcohol.

7. The method of claim 3 wherein the second solvent is 5 to 15% by volume of the printer ink solution.

8. The method of claim 3 wherein exfoliating graphite in the alcohol comprises:
using sonication power to exfoliate the graphite.

9. The method of claim 8 wherein the alcohol is ethanol.

10. The method of claim 3 wherein the polymer is one of ethyl cellulose or polyvinylpyrrolidone.

11. The method of claim 3 further comprising:
applying a centrifugal force after exfoliating the graphite.

12. The method of Claim 8 wherein flocculating the graphite flakes in the alcohol comprises:
adding a salt solution to the graphite flakes in the alcohol.

13. The method of claim 3 further comprising:
determining a content of graphene after adding the stabilizing polymer.

14. The method of claim 3 further comprising:
filtering the stabilized graphene powder.

15. The method of claim 1 further comprising agitating the printer ink solution after producing the printer ink solution.

* * * * *